(12) United States Patent
Nakashima et al.

(10) Patent No.: US 7,745,094 B2
(45) Date of Patent: Jun. 29, 2010

(54) RESIST COMPOSITION AND PATTERNING PROCESS USING THE SAME

(75) Inventors: Mutsuo Nakashima, Joetsu (JP); Yoshitaka Hamada, Joetsu (JP); Katsuya Takemura, Joetsu (JP); Kazumi Noda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 664 days.

(21) Appl. No.: 11/702,658

(22) Filed: Feb. 6, 2007

(65) Prior Publication Data

US 2007/0190457 A1 Aug. 16, 2007

(30) Foreign Application Priority Data

Feb. 13, 2006 (JP) ............................. 2006-035111

(51) Int. Cl.
  G03F 7/00 (2006.01)
  G03F 7/004 (2006.01)
  G03F 7/075 (2006.01)

(52) U.S. Cl. ................... 430/270.1; 430/322; 430/331; 430/913; 524/99

(58) Field of Classification Search .............. 430/270.1, 430/331, 913, 322; 524/99
  See application file for complete search history.

(56) References Cited

U.S. PATENT DOCUMENTS

| 5,972,560 | A | 10/1999 | Kaneko et al. | |
| 6,004,724 | A | 12/1999 | Yamato et al. | |
| 6,261,738 | B1 | 7/2001 | Asakura et al. | |
| 6,730,453 | B2 | 5/2004 | Nakashima et al. | |
| 6,998,722 | B2 | 2/2006 | Madurawe | |
| 7,108,955 | B2 * | 9/2006 | Iwasawa et al. | 430/270.1 |
| 7,510,816 | B2 * | 3/2009 | Takemura et al. | 430/270.1 |
| 2002/0085165 | A1 | 7/2002 | Fukumoto et al. | |
| 2004/0143082 | A1 * | 7/2004 | Iwasawa et al. | 528/25 |
| 2006/0073413 | A1 * | 4/2006 | Takemura et al. | 430/270.1 |

FOREIGN PATENT DOCUMENTS

| EP | 1398339 A1 * | 3/2004 |
| JP | 9-95479 A | 4/1997 |
| JP | 9-208554 A | 8/1997 |
| JP | 9-230588 A | 9/1997 |
| JP | 9-301948 A | 11/1997 |
| JP | 10-324748 A | 12/1998 |
| JP | 2906999 B2 | 4/1999 |
| JP | 11-302382 A | 11/1999 |
| JP | 2000-314956 A | 11/2000 |
| JP | 2001-215714 A | 8/2001 |
| JP | 2002-55346 A | 2/2002 |
| JP | 2002-220471 A | 8/2002 |
| JP | 2002-268227 A | 9/2002 |
| JP | 2002-278073 A | 9/2002 |
| JP | 2003-20335 A | 1/2003 |
| JP | 2003-173027 A | 6/2003 |
| JP | 2004-149754 A | 5/2004 |
| JP | 2004210771 A * | 7/2004 |
| JP | 2005029742 A * | 2/2005 |
| JP | 2005126592 A * | 5/2005 |

OTHER PUBLICATIONS

Ito et al., "Fluoropolymers for 157/193 nm Lithography: Chemistry, New Platform, Formulation Strategy and Lithographic Evaluation", Journal of Photopolymer Science and Technology, vol. 15, No. 4 (2002), pp. 591-602.
Arimitsu et al., "Sensitivity Enhancement of Chemical-Amplification-Type Photoimaging Materials by Acetoacetic Acid Derivatives", J. Photopolym. Sci. and Tech., (1995), vol. 8, 43-44, 45-46.
Arimitsu et al., "Effect of Phenolic Hydroxyl Residues on the Improvement of Acid-Proliferation-Type Photoimaging Materials", J. Photopolym. Sci. and Tech., (1996), vol. 9, pp. 29-30.

* cited by examiner

Primary Examiner—Amanda C. Walke
(74) Attorney, Agent, or Firm—Birch, Stewart, Kolasch & Birch, LLP

(57) ABSTRACT

A resist composition is provided comprising a silicone resin, a photoacid generator, a nitrogen-containing organic compound, and a solvent. The silicone resin is obtained through cohydrolytic condensation of a mixture of three silane monomers containing a fluorinated norbornane group, an organic group having a carboxyl group protected with an acid labile group, and a lactone ring-bearing organic group, respectively. The resist composition has satisfactory resolution and overcomes the problem of a low selective etching ratio between resist film and organic film during oxygen reactive etching.

8 Claims, No Drawings ions to which the resist coating is resistant. Once the resist pattern is transferred to the intermediate coating, the substrate is processed by etching through the pattern-transferred intermediate coating as an etching mask. A typical process uses a silicon-containing resin as the resist composition and an aromatic resin as the intermediate coating. In this process, after a pattern is formed in the silicon-containing resin, oxygen-reactive ion etching is carried out. Then the silicon-containing resin is converted to silicon oxide having high resistance to oxygen plasma etching, and at the same time, the aromatic resin is readily etched away where the etching mask of silicon oxide is absent, whereby the pattern of the silicon-containing resin is transferred to the aromatic resin layer. Unlike the single layer resist coating, the aromatic resin need not have light transmittance at all, allowing for use of a wide variety of aromatic resins having high resistance to etching with fluorine or chlorine gas plasma. Using the aromatic resin as the etching mask, the substrate to be processed can be etched with fluorine or chlorine gas plasma.

RESIST COMPOSITION AND PATTERNING PROCESS USING THE SAME

CROSS-REFERENCE TO RELATED APPLICATION

This non-provisional application claims priority under 35 U.S.C. §119(a) on Patent Application No. 2006-035111 filed in Japan on Feb. 13, 2006, the entire contents of which are hereby incorporated by reference.

TECHNICAL FIELD

This invention relates to positive resist compositions for use in the photolithography, especially bilayer resist process. More particularly, it relates to positive photoresist compositions intended for the photolithography using deep-ultraviolet or the lithography using x-ray or electron beam, which compositions are effective in preventing pattern collapse by swelling and have resistance to oxygen-based gas plasma etching; and a patterning process using the resist compositions.

BACKGROUND OF THE INVENTION

In the drive for higher integration and operating speeds in LSI devices, the pattern rule is made drastically finer. Under the miniaturizing trend, the lithography has achieved formation of finer patterns by using a light source with a shorter wavelength and by a choice of a proper resist composition for the shorter wavelength. Predominant among others are positive resist compositions which are used as a single layer. These single layer positive resist compositions are based on resins possessing a structure having resistance to etching with chlorine or fluorine gas plasma and provided with a resist mechanism that exposed areas become dissolvable. Typically, the resist composition is coated on a processable substrate and exposed to a pattern of light, after which the exposed areas of the resist coating are dissolved to form a pattern. Then, the substrate can be processed by etching with the remaining resist pattern serving as an etching mask.

In an attempt to achieve a finer feature size, i.e., to reduce the pattern width with the thickness of a resist coating kept unchanged, the resist coating becomes low in resolution performance. If the resist coating is developed with a liquid developer to form a pattern, the so-called "aspect ratio" (depth/width) of the resist pattern becomes too high, resulting in pattern collapse. For this reason, the miniaturization is accompanied by a thickness reduction of the resist coating (thinner coating). On the other hand, with the progress of the exposure wavelength toward a shorter wavelength, the resin in resist compositions is required to have less light absorption at the exposure wavelength. In response to changes from i-line to KrF and to ArF, the resin has made a transition from novolac resins to polyhydroxystyrene and to acrylic resins. Actually, the etching rate under the above-indicated etching conditions has been accelerated. This suggests the inevitableness that a processable substrate is etched through a thinner resist coating having weaker etching resistance. It is urgently required to endow the resist coating with etching resistance.

Meanwhile, a process known as multilayer resist process was developed in the art for processing a (processable) substrate by etching. The process uses a resist coating which has weak etching resistance under the etching conditions for the substrate, but is capable of forming a finer pattern, and an intermediate coating which has resistance to etching for processing the substrate and can be patterned under the condi- With respect to the bilayer resist process, active studies were made on the exposure to the radiation (193 nm) of ArF excimer laser and radiation of shorter wavelength where aromatic resins can be no longer used, and several reports have already been made. For example, JP-A 10-324748 and JP-A 11-302382 disclose a siloxane polymer having carboxyl group-containing, non-aromatic monocyclic or polycyclic hydrocarbon groups or bridged cyclic hydrocarbon groups on side chains wherein at least some of the carboxyl groups are substituted with acid labile groups, for example, a siloxane polymer in which a norbornyl group having a t-butoxycarbonyl group at 5-position is bonded to a silicon atom, and a resist composition comprising the polymer. Allegedly this resist composition is less absorptive to KrF (248 nm) excimer laser or ArF excimer laser radiation, forms a pattern of good profile, and is improved in sensitivity, resolution and dry etching resistance. Also, JP-A 2002-055346 and JP-A 2002-268227 disclose that silicone-containing polymers having fluorinated alcohol incorporated therein are less absorptive at the wavelength (157 nm) of $F_2$ laser and improved in sensitivity, resolution and plasma etching resistance.

For the technology intended to improve resolution by reducing the wavelength of an exposure light source, there have been reported compositions using fluorinated siloxane polymers having less absorption at the exposure wavelength of $F_2$ laser. For example, JP-A 2002-220471 discloses that a radiation-sensitive resin composition comprising a polysiloxane having a specific acid-assisted leaving group linked to a silicon atom via at least two bicyclo[2.2.1]heptane rings is useful in that it is improved in dry etching resistance and highly transparent to the radiation of $F_2$ laser. Also, JP-A 2002-278073, JP-A 2003-20335, and JP-A 2003-173027 disclose resist compositions comprising siloxane polymers, featuring minimized absorption of ArF excimer laser radiation and a high resolution. In particular, JP-A 2003-20335 describes that high transparency even to $F_2$ laser wavelength is achieved by introducing fluorine. With respect to the technique of improving resolution by forming a thinner coating of resist material, JP-A 2001-215714 discloses that a silicon-containing polymer having a viscosity in a specific range enables to form a thinner resist coating while maintaining in-plane uniformity in the resist coating.

Among the recent studies on single layer resist coatings where attempts were made to form a finer pattern, it was reported as the cause of pattern collapse that the polymer undergoes substantial swelling immediately before dissolution during development, which inhibits formation of a finer pattern. One effective measure for preventing such swell is to introduce a unit containing a hydroxyl group having an appropriate increased acidity due to fluorine substitution at proximate positions, into a resin as a polar group. See H. Ito et al., Journal of Photopolymer Science and Technology, Vol. 15, No. 4 (2002), 591-602. The pattern collapse is a common problem to silicon-containing resist compositions comprising silicone resins as a base polymer. There is a possibility that the high resolution of the aforementioned polysiloxane polymer be accompanied by this effect.

However, in an actual practice, an attempt to transfer a pattern to an aromatic resin organic coating using a fluorine-rich resin as an etching mask revealed that its resistance to oxygen-reactive etching is far below the expectation. There is a need for further improvement in resistance to etching under these conditions.

DISCLOSURE OF THE INVENTION

An object of the present invention is to provide a silicone resin-containing resist composition for the bilayer process which enables to form a finer pattern by minimizing the pattern collapse by swelling and which exhibits improved resistance to the etching used in the pattern transfer to an underlying organic film; and a patterning process using the resist composition.

The inventors have found that a resist composition having high resolution and acceptable resistance to the etching conditions associated with an aromatic organic film is obtainable by introducing into a silicone resin constituting a resist composition, three structural units: a carboxylic acid protected with an acid labile group for acquiring a high dissolution contrast for affording a high resolution, a hydroxyl group with fluorine substitution at proximate positions for preventing swelling, and a lactone structure for enhancing swelling prevention and preventing the etching resistance from lowering and especially, a lactone structure having a five or six-membered ring skeleton.

Accordingly, the present invention provides a resist composition and a patterning process as defined below.

In one aspect, the present invention provides a resist composition comprising (A) a silicone resin, (B) an acid generator, (C) an organic nitrogen-containing compound, and (D) an organic solvent. The silicone resin (A) is obtained through cohydrolytic condensation of a mixture comprising hydrolyzable silane monomers having the general formulae (1), (2) and (3):

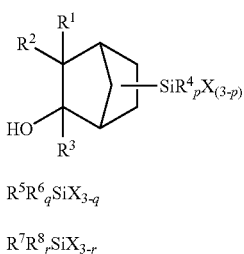

wherein $R^1$, $R^2$, and $R^3$ each are hydrogen, fluorine, $C_1$-$C_4$ alkyl or $C_1$-$C_4$ fluoroalkyl group, at least one of $R^1$, $R^2$, and $R^3$ contains fluorine, $R^4$ is a $C_1$-$C_6$ hydrocarbon group with a straight, branched or cyclic structure; $R^5$ is a $C_3$-$C_{20}$ organic group with a straight, branched, cyclic or polycyclic structure, which has a carboxyl group protected with an acid-decomposable protecting group as a functional group and which may further contain a halogen, oxygen or sulfur atom, $R^6$ is as defined for $R^4$; $R^7$ is a $C_4$-$C_{16}$ organic group which has a lactone ring as a functional group and which may further contain a halogen, oxygen or sulfur atom, $R^8$ is as defined for $R^4$; X is hydrogen, chlorine, bromine, or a straight, branched or cyclic $C_1$-$C_6$ alkoxy group; p is 0 or 1, q is 0 or 1, and r is 0 or 1.

In a preferred embodiment, the silane monomer of formula (1) is a silane monomer having the structure (4):

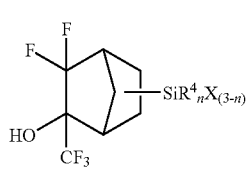

wherein $R^4$ and X are as defined above, and n is 0 or 1.

In a preferred embodiment, $R^7$ in formula (3) is an organic group having an alicyclic structure and a 5-membered lactone structure bonded thereto, and the silicon atom is bonded to one of carbon atoms in the alicyclic structure. The preferred silane monomer of formula (3) is a silane monomer having the structure (5) or (6):

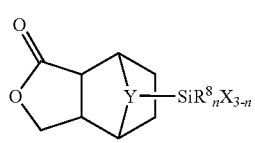

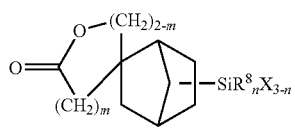

wherein Y is an oxygen atom, sulfur atom or methylene group, $R^8$ and X are as defined above, n is 0 or 1, and m is 0 or 1.

In a preferred embodiment, the mixture further comprises a hydrolyzable monomer having at least two hydrolyzable substituent groups other than formulae (1), (2) and (3). Typically, the mixture may further comprise a compound having the general formula (7):

$$SiX_4 \quad (7)$$

wherein X is as defined above.

In another aspect, the invention provides a pattern forming process comprising the steps of forming a pattern on an aromatic-containing resin film using the resist composition defined above, and etching the resin film through the resulting pattern as an etching mask for thereby patterning the resin film. Typically, the etching step uses a gas plasma containing oxygen.

BENEFITS OF THE INVENTION

As compared with a prior art resist composition using as a polar group an alcohol whose proximate carbon atom is fluorinated, the resist composition of the invention exhibits at least equal resolution. At the same time, it overcomes the problem that the prior art resist composition fails to establish a selective etching ratio between the resist and an underlying film of organic material during oxygen reactive etching. Therefore, the resist composition of the invention is advantageously used in the bilayer resist process using ArF exposure.

It is noted that the phrase "$C_1$-$C_4$," as used herein, for example, is a carbon number range ranging from 1 to 4.

DESCRIPTION OF THE PREFERRED EMBODIMENTS

The resist composition of the invention comprises (A) a silicone resin, (B) an acid generator, (C) an organic nitrogen-containing compound, and (D) an organic solvent.

The silicone resin (A) is obtained through cohydrolytic condensation of a mixture comprising three silane monomers as essential components. That is, the mixture comprises hydrolyzable silane monomers having the general formulae (1), (2), and (3).

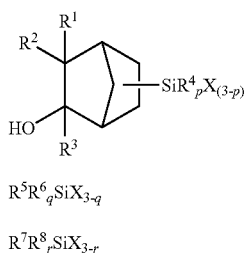

$$R^5R^6_qSiX_{3-q} \quad (2)$$

$$R^7R^8_rSiX_{3-r} \quad (3)$$

Herein $R^1$, $R^2$, and $R^3$ each are a hydrogen atom, fluorine atom, $C_1$-$C_4$ alkyl or $C_1$-$C_4$ fluoroalkyl group, and at least one of $R^1$, $R^2$, and $R^3$ contains fluorine. $R^4$ is a $C_1$-$C_6$ hydrocarbon group having a straight, branched or cyclic structure.

$R^5$ is a $C_3$-$C_{20}$ organic group having a straight, branched, cyclic or polycyclic structure, which has a carboxyl group protected with an acid-decomposable protecting group as a functional group and which may further contain a halogen, oxygen or sulfur atom in addition to the carboxyl group. $R^6$ is as defined for $R^4$.

$R^7$ is a $C_4$-$C_{16}$ organic group which has a lactone ring as a functional group and which may further contain a halogen, oxygen or sulfur atom in addition to the lactone ring. $R^8$ is as defined for $R^4$.

X is a hydrogen atom, chlorine atom, bromine atom, or straight, branched or cyclic $C_1$-$C_6$ alkoxy group. The subscript p is 0 or 1, q is 0 or 1, and r is 0 or 1.

The unit having formula (1) is incorporated as a polar group capable of controlling swell. It contributes to this effect that unlike ordinary alcohols, the hydroxyl group on norbornane ring affords an adequate acidity because the density of electrons on oxygen is reduced due to the strong attraction of electrons by fluorine atoms bonded at proximate positions. A number of such fluorine-substituted alcohol derivatives have already been reported. A silane monomer can be produced by effecting hydrosilylation between such a derivative having an unsaturated bond and a SiH group-containing silane. Of the monomers belonging to this unit, a choice of a single monomer may be made or a mixture of two or more monomers may be used. Some typical examples are given below.

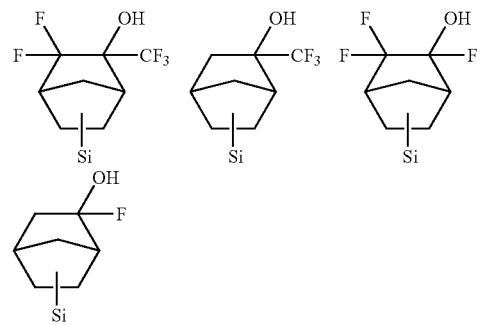

In the unit having formula (2), $R^5$ is a side chain having carboxylic acid protected with an acid labile group (i.e., carboxyl group protected with an acid-decomposable protecting group), which functions to establish differential dissolution between exposed and unexposed areas. The acid labile group is a technical term generally used in the resist-related art. The acid labile group with which a functional group is protected functions such that when a strong acid is generated from a photoacid generator upon exposure, the bond between the acid labile group and the functional group is scissored under the catalysis of the strong acid. As a result of scission, carboxylic acid is regenerated herein. The protecting group used herein may be any of well-known groups. When carboxylic acid is to be protected, the preferred protecting groups are $C_4$-$C_{20}$ tertiary alkyl groups, $C_3$-$C_{18}$ trialkylsilyl groups, and $C_4$-$C_{20}$ oxoalkyl groups. Of the tertiary alkyl groups, those tertiary alkyl groups in which substituent groups on a tertiary carbon atom are substituted so as to form a 5- to 7-membered ring with that tertiary carbon and those tertiary alkyl groups in which a carbon chain bonded to a tertiary carbon atom has a branched or cyclic structure are most preferred because they afford high resolution.

The side chain bearing carboxylic acid to be protected is a $C_3$-$C_{20}$ organic group with a straight, branched, cyclic or polycyclic structure which may contain a halogen, oxygen or sulfur atom. As in the previous case, this monomer is also readily obtainable by hydrosilylation of a protected carboxylic acid derivative having an unsaturated carbon bond with an SiH group-containing silane. Of these, those monomers in which both silicon and a protected carboxyl group are in direct bond with a norbornane ring or tetracyclododecene ring are most preferred because they afford high resolution. Preferred examples of these units are given below.

Preferred examples of protecting groups:

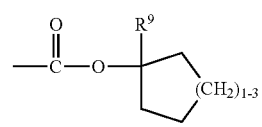

$R^9$: $C_1$-$C_6$ straight, branched or cyclic alkyl

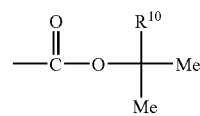

$R^{10}$: $C_2$-$C_6$ straight, branched or cyclic alkyl, norbornyl or adamantyl Me: methyl

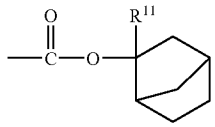

$R^{11}$: $C_1$-$C_6$ straight or branched alkyl

Preferred examples of carboxylic acid protected with the protecting group which is a silicone monomer side chain:

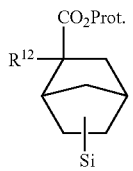

$R^{12}$: hydrogen, fluorine, methyl or trifluoromethyl

Prot.: protecting group

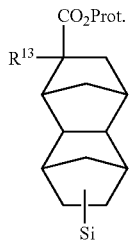

$R^{13}$: hydrogen, fluorine, methyl or trifluoromethyl

Prot.: protecting group

Like the unit of formula (1), for the unit of formula (2), a single monomer or a mixture of monomers belonging to this unit may be used.

The unit of formula (3) ensures that the silicone resin has a necessary polarity and serves as a second polar group functioning to reduce the necessary quantity of the unit of formula (2). With respect to the polar group, a number of polar groups including hydroxy, carbonyloxyalkyl, carboxyl and carbonate groups have been disclosed. An actual attempt to combine the unit of formula (1) with the unit of formula (2) failed to provide such an effect as exerted by acrylic acid polymers for the single layer use, that is, failed to provide high resolution. By contrast, the additional use of the lactone structure-bearing unit having formula (3) is successful in establishing both polarity and high resolution. The most simple routes for introducing a lactone structure include a route of using a bromine-substituted lactone, extending a straight chain linker from the lactone, and deriving it to a silicone monomer and another synthesis route of hydrosilylation reaction of an SiH group-containing silane and an unsaturated cyclic lactone. The silane monomers having a lactone structure which have been reported include those monomers having lactone incorporated in a cyclic structure, those monomers having a linker, and those monomers in which lactone is linked to a cyclic structure via a linker (see JP-A 2002-268227). Of these, the monomers having an alicyclic structure and further a five-membered lactone structure bonded thereto, and having a side chain in which a silicon atom is bonded to one of carbon atoms within the alicyclic structure are most preferred because the highest resolution is accomplished.

Two silicone monomer side chains affording the best resolution are illustrated below.

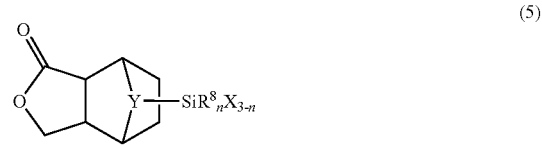

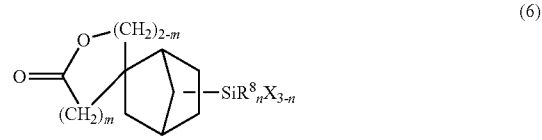

Herein Y is an oxygen atom, sulfur atom or methylene group, $R^8$ and X are as defined above, n is 0 or 1, and m is 0 or 1.

Of the above-illustrated compounds of the general formula (5), those compounds wherein Y is oxygen are more preferred as the side chain for use in the inventive composition because of a more polar effect. Of the above-illustrated compounds of the general formula (6), those compounds wherein m is 0 and those compounds wherein m is 1 may be used alone or in admixture.

Like the units of formulae (1) and (2), for the unit of formula (3), a single monomer or a mixture of monomers belonging to this unit may be used.

The monomers of the general formulae (1), (2) and (3) having the aforementioned three functions, respectively, which are used in cohydrolytic condensation reaction may be monomers having two X's (referred to as divalent monomers, hereinafter) or monomers having three X's (referred to as trivalent monomers, hereinafter). X is a hydrolyzable substituent group selected from among hydrogen, chlorine, bromine, and straight, branched or cyclic $C_1$-$C_6$ alkoxy groups. X in one monomer molecule may be one selected from the foregoing, or a mixture of different hydrolyzable groups. The situation where p, q or r is 0 means trivalent and the situation where p, q or r is 1 means divalent. There may be used either divalent or trivalent monomers or mixtures thereof. When divalent monomers account for 50 mol % or more based on the entire monomers of formulae (1), (2) and (3), a silicone resin resulting from condensation of these monomers is unlikely to solidify and thus difficult to purify. For this reason, it is recommended to use trivalent monomers in an amount of more than 50 mol % based on the entire monomers. It is preferred that X be alkoxy groups, especially methoxy and ethoxy.

When the divalent monomer is used, the other side chain $R^4$, $R^6$ or $R^8$ from silicon may be selected from simple groups because no particular function is assigned thereto. Since a carbon number in excess of 6 tends to interfere with purification by distillation or the like, a choice is preferably made of hydrocarbon groups having not more than 6 carbon atoms, especially alkyl and phenyl groups.

In the reaction solution where cohydrolysis is effected, the monomers are mixed in a certain ratio. First of all, the mixing ratio of the monomer of formula (2) to the entire silane monomers is determined because a dissolution contrast between exposed and unexposed areas of a resist coating is almost dictated by this ratio. The ratio of the monomer (2) is preferably 5 to 80 mol %, more preferably 10 to 50 mol %, based on the entire silane monomers although it varies somewhat with the molecular weight of the protecting group or the like.

Next, the total amount of polar groups, that is, the total amount of the monomers of formulae (1) and (3) is preferably 20 to 95 mol %, more preferably 50 to 90 mol %, based on the entire silane monomers. If these units are in short, the resist pattern can collapse by peeling and swelling during development. If these units are in excess, the resist coating may have a lower contrast and lower resolution.

With respect to the ratio of the monomer of formula (1) to the monomer of formula (3), if one monomer is less than 10 mol % based on the total of these two monomers, the function of the one monomer is not available. It is thus preferred that each monomer be 10 to 90 mol % based on the total of monomers of formulae (1) and (3).

During the cohydrolysis, at least one hydrolyzable silane monomer having at least two hydrolyzable substituent groups other than the monomers of formulae (1) to (3) may be added as long as the amount thereof is up to 30 mol % based on the entire monomers.

The other hydrolyzable silane monomers which can be added include silane monomers having the general formula (7):

$$SiX_4 \qquad (7)$$

wherein X is as defined above, and silane monomers of the following formulae:

wherein $R^4$ and X are as defined above.

Where all silane monomers have bulky side chains, for example, only a lower molecular weight product can be obtained by mere adjustment of condensation conditions. In such a situation, the molecular weight can be increased by adding a monomer in which the organic group(s) bonded to a silicon atom, other than the hydrolyzable groups, is solely an alkyl group of up to 4 carbon atoms, such as methyltriethoxysilane and tetraethoxysilane. As is known in the art, when it is desired to enhance the transparency of a resin to exposure light of a shorter wavelength, for example, light of 157 nm, the desired effect is achieved by increasing the number of fluorine atoms per unit weight of the resin. To further impart such transparency to the resist composition of the invention, the addition of a halosilane or alkoxysilane having a fluoroalkyl group incorporated therein is effective.

The cohydrolytic condensate can be produced according to the ordinary way of cohydrolytic condensation. Specifically, a mixture of hydrolyzable silane compounds is contacted with a sufficient amount of water to induce cohydrolytic condensation whereupon cohydrolytic condensation is effected to synthesize the desired product. The reaction may be effected in the presence of an acid catalyst or base catalyst and also in an organic solvent. Examples of suitable acid catalysts used in the reaction include hydrochloric acid, nitric acid, acetic acid, oxalic acid, sulfuric acid, methanesulfonic acid, p-toluenesulfonic acid, trifluoroacetic acid, trifluoromethanesulfonic acid, perchloric acid, phosphoric acid and citric acid. Examples of suitable base catalysts include ammonia, methylamine, dimethylamine, ethylamine, diethylamine, triethylamine, sodium hydroxide, potassium hydroxide, tetramethylammonium hydroxide, tetrapropylammonium hydroxide, choline, diethylhydroxylamine, 1,8-diazabicyclo[5.4.0]-7-undecene (DBU), and 1,5-diazabicyclo[4.3.0]-5-nonene (DBN). Suitable organic solvents include polar solvents such as ethanol, isopropyl alcohol (IPA), methyl isobutyl ketone (MIBK), acetonitrile, dimethylacetamide (DMA), and dimethylformamide (DMF), and aromatic solvents such as benzene, toluene, and xylene, which may be used alone or in admixture.

Although the amounts of water and organic solvent are not particularly limited, the amount of water used is preferably 150 to 5,000 mol % based on the silane reactants, and the amount of organic solvent used is preferably 50 to 1,000% by weight based on the silane reactants. An appropriate amount of the catalyst used is 0.01 to 30 mol % based on the silane reactants. Cohydrolytic condensation may be effected at a temperature of 0 to 60° C. and the reaction time is generally about 30 minutes to about 120 hours.

The silicone resin produced as the cohydrolytic condensate should preferably have a weight average molecular weight (Mw) of 1,000 to 100,000, more preferably 1,000 to 30,000, and even more preferably 1,500 to 20,000, as measured by gel permeation chromatography (GPC) versus polystyrene standards. Resins having a Mw in excess of 100,000 may be difficult to purify, resins having a Mw in excess of 30,000 tend to decline in resolution, though depending on a combination of monomers, and resins having a Mw in excess of 20,000 may have similar tendency. Resins having a Mw of less than 1,500 tend to have a rounded pattern profile, and resins having a Mw of less than 1,000 may have more tendency. During subsequent etching of the underlying film, such a rounded pattern profile can cause to prevent perpendicular etching of the film.

Component (B) in the resist composition of the invention is an acid generator, typically photoacid generator. When a resist coating is formed from a resist composition and exposed to a pattern of light, the photoacid generator in the resist composition functions to generate an acid upon receipt of the energy of light. In a resist coating made of the inventive resist composition, the acid thus generated serves as a catalyst to act on the acid-decomposable protecting group of the protected carboxyl group as the silicone resin side chain, scissoring off the protecting group and rendering the carboxyl group free and thus turning the silicone resin to be dissolvable in an aqueous alkaline developer. With respect to the photoacid generator, a number of technical reports have already been made in conjunction with non-silicone resist compositions. For example, JP-A 2004-149754 describes numerous exemplary photoacid generators. Basically, all such known photoacid generators are applicable to the present invention. Preferred photoacid generators are sulfonium salts, iodonium salts, sulfonyldiazomethanes, N-sulfonyloxyimides, and N-sulfonyloxyoximes. Such photoacid generators may be used as a mixture of generators of the same family or generators of different families. In such mixtures, the predominant photoacid generator is often an onium salt, especially a sulfonium salt. It is also effective to use another photoacid generator as an auxiliary.

Sulfonium salts are salts of sulfonium cations with sulfonates. Exemplary sulfonium cations include substituted or unsubstituted triphenyl sulfoniums such as triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)

diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium; substituted or unsubstituted allyl sulfoniums such as 2-naphthyldiphenylsulfonium, dimethyl-2-naphthylsulfonium; and sulfoniums having a non-aromatic substituent group, such as 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium.

Exemplary sulfonates include sulfonates in which carbon in proximity to the sulfonyl group is substituted with fluorine, such as trifluoromethanesulfonate, nonafluorobutanesulfonate, heptadecafluorooctanesulfonate, 2,2,2-trifluoroethanesulfonate, perfluoro-4-ethylcyclohexanesulfonate, and pentafluorobenzenesulfonate; aromatic sulfonates such as 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, and naphthalenesulfonate; and alkylsulfonates such as camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary are combinations of aryliodonium cations such as diphenyliodinium, bis(4-tert-butylphenyl)iodonium, 4-tert-butoxyphenylphenyliodonium, and 4-methoxyphenylphenyliodonium with the foregoing sulfonates.

Exemplary sulfonyldiazomethane compounds include alkyl-substituted sulfonyldiazomethane compounds such as bis(1,1-dimethylethylsulfonyl)diazomethane and bis(cyclohexylsulfonyl)diazomethane; fluoroalkyl-substituted sulfonyldiazomethane compounds such as bis(perfluoroisopropylsulfonyl)diazomethane; and allyl-substituted sulfonyldiazomethane compounds such as bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, and tert-butoxycarbonyl-4-methylphenylsulfonyldiazomethane.

N-sulfonyloxyimide photoacid generators include combinations of imide structures with sulfonates. Exemplary imide structures are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are as described in Japanese Patent No. 2,906,999 and JP-A 9-301948. Examples include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)- ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyl-oxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; and 2,2,2-trifluoro-1-[1-dioxathiophen-2-yl)]-ethanone oxime-O-propylsulfonate.

Also included are the oxime sulfonates described in JP-A 9-95479 and JP-A 9-230588 and the references cited therein, for example, α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Of the photoacid generators, sulfonium salts are preferred. For the cation side, triphenylsulfonium, 4-methylphenyldiphenylsulfonium, 4-tert-butoxyphenyldiphenylsulfonium, 4-tert-butylphenyldiphenylsulfonium, tris(4-tert-butylphenyl)sulfonium, 4-alkoxynaphthyltetrahydrothiophenium, phenacyldiphenylsulfonium, and phenacyltetrahydrothiophenium are useful cations having a high sensitivity and acceptable stability. For the anion side, sulfonic acids in which carbon proximate to the sulfonyl group is fluorinated, such as perfluorobutanesulfonate, perfluorooctanesulfonate and perfluoro-4-ethylcyclohexanesulfonate are preferred because they provide a higher resolution.

In the resist composition of the invention, the photoacid generator may be added in any desired amount, typically from 0.3 to 10 parts, preferably from 0.5 to 5 parts by weight, per 100 parts by weight of the silicone resin (A). Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist coating.

Component (C) in the resist composition is an organic nitrogen-containing compound. In the resist composition, one or more organic nitrogen-containing compounds may be compounded. The organic nitrogen-containing compound is compounded for the purpose of suppressing the rate of diffusion when the acid generated by the acid generator diffuses within the resist film. It holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds or basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (C)-1 may also be included alone or in admixture.

(C)-1

In the formula, n is equal to 1, 2 or 3; side chain G1 is independently selected from groups of the following general formulae (L)-1 to (L)-3; side chain G2 is independently hydrogen or a straight, branched or cyclic $C_1$-$C_{20}$ alkyl group which may contain an ether or hydroxyl group. When n is 2 or 3, G1's may be the same or different. In this case, two or three G1's may bond together to form a ring. More specifically, terminal groups on two or three structures of one or more of formulae (L)-1 to (L)-3 (e.g., $R^{15}$ radicals, $R^{18}$ radicals, $R^{20}$ radicals, or $R^{15}$ and $R^{18}$ radicals, $R^{15}$ and $R^{20}$ radicals, $R^{18}$ and $R^{20}$ radicals) may bond together to form a ring.

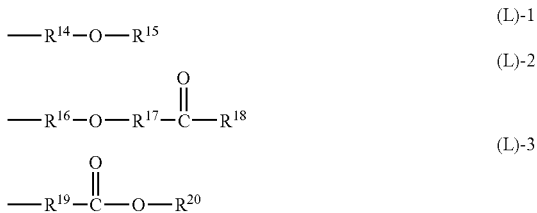

In the formulae, $R^{14}$, $R^{16}$ and $R^{19}$ are independently straight or branched $C_1$-$C_4$ alkylene groups; $R^{15}$ and $R^{18}$ are independently hydrogen or straight, branched or cyclic $C_1$-$C_{20}$ alkyl groups, which may contain at least one hydroxyl, ether, ester group or lactone ring; $R^{17}$ is a single bond or a straight or branched $C_1$-$C_4$ alkylene group; and $R^{20}$ is hydrogen or a straight, branched or cyclic $C_1$-$C_{20}$ alkyl group, which may contain at least one hydroxyl, ether, ester group or lactone ring.

Illustrative examples of the compounds of formula (C)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more basic compounds having cyclic structure represented by the following general formula (C)-2.

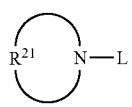
(C)-2

Herein L is selected from the three structures having formulae (L)-1 to (L)-3, and $R^{21}$ is a straight or branched $C_2$-$C_{20}$ alkylene group which may contain one or more carbonyl, ether, ester or sulfide groups.

Illustrative examples of the basic compounds having formula (C)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more basic compounds having cyano group represented by the following general formulae (C)-3 to (C)-6 may be blended.

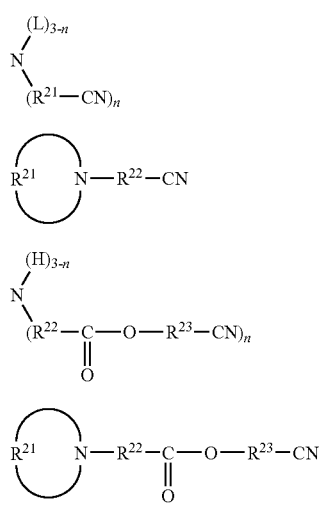

Herein, L, $R^{21}$ and n are as defined above, and $R^{22}$ and $R^{23}$ are each independently a straight or branched $C_1$-$C_4$ alkylene group.

Illustrative examples of the basic compounds having cyano represented by formulae (C)-3 to (C)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononittrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy) ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole skeleton and a polar functional group, represented by the general formula (C)-7.

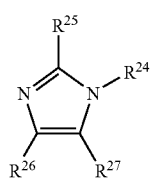

Herein, $R^{24}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{25}$, $R^{26}$ and $R^{27}$ are each independently a hydrogen atom, a straight, branched or cyclic alkyl, aryl or aralkyl group having 1 to 10 carbon atoms.

Also included are organic nitrogen-containing compounds having a benzimidazole skeleton and a polar functional group, represented by the general formula (C)-8.

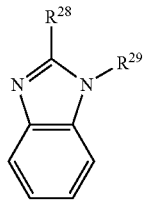
(C)-8

Herein, $R^{28}$ is a hydrogen atom, a straight, branched or cyclic alkyl, aryl or aralkyl group having 1 to 10 carbon atoms. $R^{29}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (C)-9 and (C)-10.

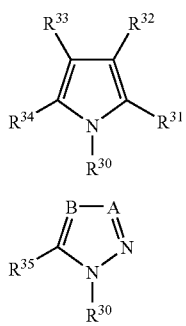
(C)-9

(C)-10

Herein, A is a nitrogen atom or C—$R^{36}$, B is a nitrogen atom or C—$R^{37}$, $R^{30}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{31}$, $R^{32}$, $R^{33}$ and $R^{34}$ are each independently a hydrogen atom, a straight, branched or cyclic alkyl group or aryl group having 1 to 10 carbon atoms, or a pair of $R^{31}$ and $R^{32}$ and a pair of $R^{33}$ and $R^{34}$, taken together, may form a benzene, naphthalene or pyridine ring; $R^{35}$ is a hydrogen atom, a straight, branched or cyclic alkyl group or aryl group having 1 to 10 carbon atoms; $R^{36}$ and $R^{37}$ each are a hydrogen atom, a straight, branched or cyclic alkyl group or aryl group having 1 to 10 carbon atoms, or a pair of $R^{35}$ and $R^3$, taken together, may form a benzene or naphthalene ring.

The organic nitrogen-containing compound or basic compound (C) is preferably formulated in an amount of 0.001 to 2 parts, and especially 0.01 to 1 part by weight, per 100 parts by weight of the base resin (A). Less than 0.001 part of the nitrogen-containing compound achieves no or little addition effect whereas more than 2 parts would result in too low a sensitivity.

Component (D) in the resist composition of the invention is an organic solvent. The organic solvent used herein may be any organic solvent in which the base resin or solids, photo-acid generator, and other components are soluble.

Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the photoacid generator is most soluble therein.

An appropriate amount of the organic solvent used is about 200 to 1,000 parts, especially about 400 to 800 parts by weight per 100 parts by weight of the solids in the resist composition.

In the resist composition of the invention, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-amplifier compound-like behavior.

In the resist composition of the invention, an appropriate amount of the acid-amplifier compound is up to 2 parts, and especially up to 1 part by weight per 100 parts by weight of the base resin (A). Excessive amounts of the acid-amplifier compound makes diffusion control difficult, leading to degradation of resolution and pattern profile.

The resist composition of the invention may additionally include an acetylene alcohol derivative for the purpose of enhancing the shelf stability.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K. They are polyalkylene oxide alcohol derivatives having an acetylene structure within the molecule.

The acetylene alcohol derivative is preferably added in an amount of 0.01 to 2% by weight, and more preferably 0.02 to 1% by weight, based on the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film exposed through the mask to an electron beam or to high-energy radiation having a wavelength of up to 300 nm such as deep-UV radiation, excimer laser radiation or x-ray in a dose of about 1 to 200 mJ/cm$^2$, and preferably about 10 to 100 mJ/cm$^2$. The resist film is then post-exposure baked (PEB) on a hot plate at 60 to 150° C. for 10 seconds to 5 minutes, and preferably at 80 to 130° C. for 30 seconds to 3 minutes. Finally, development is carried out using as the developer an aqueous alkali solution, such as a 0.1 to 5 wt % (preferably 2 to 3 wt %) aqueous solution of tetramethylammonium hydroxide (TMAH), this being done by a conventional method such as dip, puddle, or spray development for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with deep-UV radiation or excimer laser radiation having a wavelength of 254 to 120 nm, specifically excimer lasers such as KrF (248 nm), ArF (193 nm), Kr$_2$ (146 nm), and KrAr (134 nm), and lasers such as F$_2$ (157 nm) and Ar$_2$ (126 nm), x-rays, or electron beams. The invention is applicable to not only dry light exposure, but also light exposure by the immersion process.

Described below is a method of processing a substrate using the resist composition according to the bilayer resist process. A substrate to be processed is usually an inorganic substrate. An underlying film (or organic film) is formed on the substrate. The resist composition of the invention is applied onto the underlying film to form a resist coating. If necessary, an antireflective coating may be formed between the resist composition and the underlying film. The resist coating is patterned by the above-mentioned procedure, after which the pattern is transferred to the underlying film by oxygen gas etching using the resist pattern as an etching mask. The oxygen gas etching is reactive plasma etching using oxygen gas as a main component. With this method, silicon oxide having high resistance to oxygen gas etching is formed from the resist pattern, allowing the underlying organic film to be processed at a high aspect ratio. SO$_2$, CO$_2$, CO, NH$_3$, or N$_2$ gas may be added to the oxygen gas for preventing the film from being configured to a T-top profile by over-etching. Prior to the oxygen gas etching, brief etching with a fluorocarbon gas may be carried out for removing any scum of the resist after development and smoothening line edges to prohibit roughening.

The processable film is formed on a substrate. The substrate used herein is not particularly limited and is typically made of a material different from the processable film (also referred to as processable substrate), for example, Si, α-Si, p-Si, SiO$_2$, SiN, SiON, W, TiN, Al or the like. The processable film used herein is selected from various low-k films and stop films thereof, including Si, SiO$_2$, SiON, SiN, p-Si, α-Si, W, W—Si, Al, Cu, Al—Si or the like. The processable film is generally formed to a thickness of 50 to 10,000 nm, especially 100 to 5,000 nm.

Subsequently, the processable film is subjected to dry etching. Etching with a fluorocarbon gas as a main component is carried out when the processable film is SiO$_2$ or Si$_3$N$_4$. Exemplary fluorocarbon gases are CF$_4$, CHF$_3$, CH$_2$F$_2$, C$_2$F$_6$, C$_3$F$_8$, C$_4$F$_{10}$ and CF$_{12}$. At the same time as the dry etching of the processable film, the silicon-containing resist film can be stripped off. Etching with chlorine or bromine gas as a main component is employed when the processable film is polysilicon, tungsten silicide, TiN/Al or the like.

In the bilayer resist process, the underlying film may be made of any organic material which is selected from a number of well-known organic film materials. As the organic film, aromatic resins are generally preferred, with those aromatic resins which can be crosslinked during film formation so as to prevent intermixing during coating and film formation of the resist composition thereon being especially preferred.

Suitable aromatic resins include novolac resins and polyhydroxystyrene resins. Aromatic resins further having a fluorene or indene structure are advantageously used to enhance the etching resistance of the organic film during etching of the substrate after the pattern has been transferred to the organic film. It is possible to form an antireflective coating on the organic film and to form a resist film of the invention thereon. If the organic film possesses an antireflective function, advantageously the overall process becomes simpler. To impart an antireflective function, an aromatic resin having an anthracene structure or naphthalene structure or benzene structure having a conjugated unsaturated bond is preferably used.

Crosslinks can be formed by a crosslinking method as employed for thermosetting resins and negative resist compositions. In general, a composition solution comprising a resin having functional groups such as phenol, alkoxyphenyl, alcohol or carboxylic acid, a material capable of thermal decomposition to generate an acid, and a crosslinker capable of forming crosslinks with the functional groups in the presence of an acid catalyst, such as hexaalkoxymethylmelamine is applied onto a processable substrate, and the coating is heated to generate an acid, with which crosslinks are formed.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, and Mw for weight average molecular weight. Et stands for ethyl, and Me stands for methyl.

Monomers 1 to 13 used in Synthesis Examples have the structural formulae shown below.

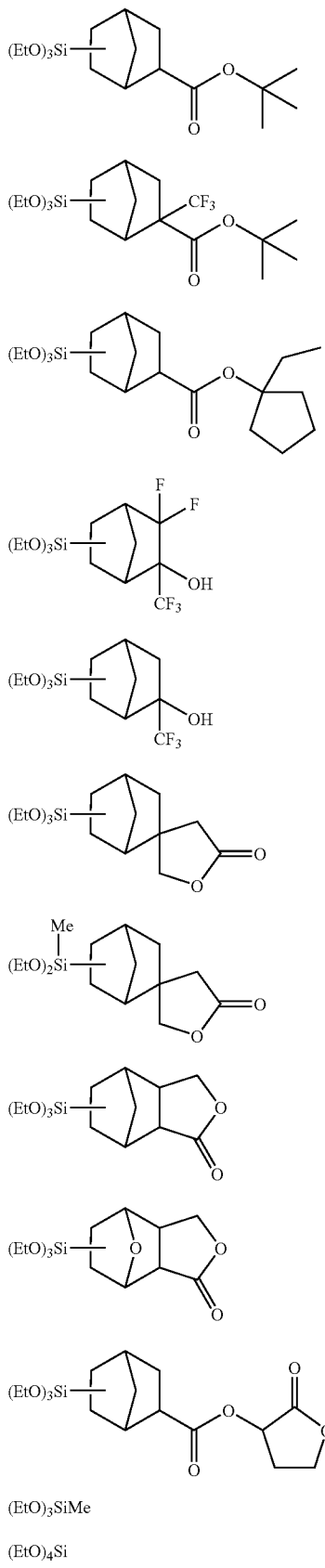

Monomer 1

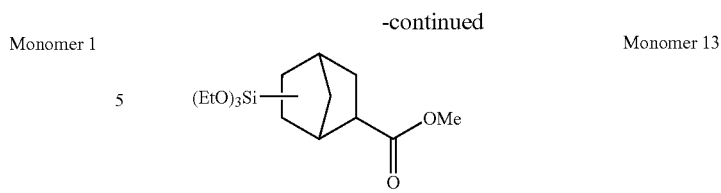

Monomer 2

Monomer 3

Monomer 4

Monomer 5

Monomer 6

Monomer 7

Monomer 8

Monomer 9

Monomer 10

Monomer 11

Monomer 12

Monomer 13

Synthesis Example 1

Synthesis of Polymer 1

A 200-ml four-necked flask equipped with a stirrer, reflux condenser, dropping funnel and thermometer was charged with 0.2 g of acetic acid, 20 g of water, and 20 g of ethanol and kept at 30° C. To the flask, a solution of 10.8 g (30 mmol) Monomer 1, 7.6 g (20 mmol) Monomer 4 and 16.4 g (50 mmol) Monomer 6 in 40 g ethanol was added dropwise over 3 hours. Subsequently the reaction mixture was ripened at 30° C. for 20 hours. The reaction mixture was repeatedly diluted with methyl isobutyl ketone and washed with water until the organic layer became neutral. It was concentrated, obtaining 26.9 g of an oligomer.

Using 50 g of toluene, the oligomer was transferred to a 100-ml three-necked flask equipped with a stirrer, reflux condenser, and thermometer. Potassium hydroxide, 56 mg, was added to the solution, which was heated under reflux over 20 hours. After cooling, the reaction solution was repeatedly diluted with methyl isobutyl ketone and washed with water until the organic layer became neutral. It was concentrated, obtaining 23.3 g of a polymer (or silicone resin).

On analysis by NMR and GPC, the polymer, designated Polymer 1, was found to consist of the units shown below and has a Mw of 3,300.

Polymer 1

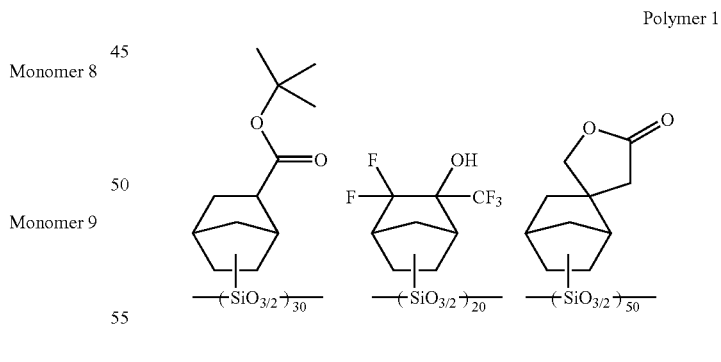

Synthesis Example 2

Synthesis of Polymers 2 to 20

Silicone resins, designated Polymers 2 to 20, were produced by the same procedure as Synthesis Example 1 using the combination of silane compounds shown in Table 1. The yield and Mw of the polymers are also shown in Table 1.

TABLE 1

| Polymer | Monomers used, amount | | | | Yield | Mw |
|---|---|---|---|---|---|---|
| Polymer 1 | Monomer 1 30 mmol | Monomer 4 20 mmol | Monomer 6 50 mmol | | 23.3 g | 3300 |
| Polymer 2 | Monomer 1 30 mmol | Monomer 5 20 mmol | Monomer 6 50 mmol | | 23.0 g | 3400 |
| Polymer 3 | Monomer 1 30 mmol | Monomer 4 30 mmol | Monomer 7 40 mmol | | 24.1 g | 2350 |
| Polymer 4 | Monomer 1 30 mmol | Monomer 4 20 mmol | Monomer 6 25 mmol | Monomer 7 25 mmol | 23.4 g | 2600 |
| Polymer 5 | Monomer 2 20 mmol | Monomer 4 20 mmol | Monomer 6 60 mmol | | 24.0 g | 3500 |
| Polymer 6 | Monomer 3 25 mmol | Monomer 4 20 mmol | Monomer 6 55 mmol | | 24.1 g | 3450 |
| Polymer 7 | Monomer 1 25 mmol | Monomer 4 15 mmol | Monomer 8 60 mmol | | 21.8 g | 3550 |
| Polymer 8 | Monomer 1 30 mmol | Monomer 4 20 mmol | Monomer 9 50 mmol | | 22.9 g | 3400 |
| Polymer 9 | Monomer 3 25 mmol | Monomer 4 20 mmol | Monomer 8 55 mmol | | 23.5 g | 3200 |
| Polymer 10 | Monomer 3 30 mmol | Monomer 5 20 mmol | Monomer 9 50 mmol | | 23.1 g | 3150 |
| Polymer 11 | Monomer 1 20 mmol | Monomer 4 40 mmol | Monomer 10 40 mmol | | 26.7 g | 3000 |
| Polymer 12 | Monomer 3 40 mmol | Monomer 4 10 mmol | Monomer 10 50 mmol | | 27.7 g | 3650 |
| Polymer 13 | Monomer 1 20 mmol | Monomer 4 10 mmol | Monomer 6 40 mmol | Monomer 11 30 mmol | 18.3 g | 6500 |
| Polymer 14 | Monomer 3 30 mmol | Monomer 5 30 mmol | Monomer 9 30 mmol | Monomer 11 10 mmol | 19.8 g | 4200 |
| Polymer 15 | Monomer 1 30 mmol | Monomer 4 30 mmol | Monomer 8 30 mmol | Monomer 11 10 mmol | 21.6 g | 3900 |
| Polymer 16 | Monomer 1 30 mmol | Monomer 4 10 mmol | Monomer 9 30 mmol | Monomer 12 30 mmol | 17.9 g | 6400 |
| Polymer 17 | Monomer 2 25 mmol | Monomer 5 25 mmol | Monomer 6 40 mmol | Monomer 12 10 mmol | 23.2 g | 3850 |
| Polymer 18 | Monomer 3 20 mmol | Monomer 4 15 mmol | Monomer 8 45 mmol | Monomer 12 20 mmol | 19.8 g | 4200 |
| Polymer 19 (Comparison) | Monomer 1 20 mmol | Monomer 4 80 mmol | | | 27.0 g | 2900 |
| Polymer 20 (Comparison) | Monomer 1 30 mmol | Monomer 4 20 mmol | Monomer 13 50 mmol | | 21.9 g | 3350 |

Examples and Comparative Examples

Resolution Evaluation

A positive resist-forming coating solution was prepared by dissolving each of the polymers (Polymers 1 to 20), a photoacid generator (PAG1: triphenylsulfonium nonafluoro-n-butanesulfonate) and a basic compound in propylene glycol monomethyl ether acetate (PGMEA) according to the recipe shown in Table 2, followed by filtration through a filter having a pore diameter of 0.2 μm. Using a spin coater, the resist solution was applied to a silicon wafer having a 55-nm antireflective coating of DUV-30J (Nissan Chemical Industries, Ltd.) formed thereon, and baked at 110° C. for 90 seconds to form a resist film of 200 nm thick. The resist film was exposed using an ArF excimer laser stepper NSR—S305B (Nikon Corporation; NA 0.68, σ 0.85), then baked (PEB) at 90° C. for 90 seconds, and developed for 60 seconds with a 2.38 wt % aqueous solution of tetramethylammonium hydroxide (TMAH), thereby giving a positive pattern.

The resulting resist patterns were evaluated as follows. The optimum exposure (sensitivity, mJ/cm$^2$) was defined as the exposure dose which provided a 1:1 resolution at the top and bottom of a 0.18-μm line-and-space pattern. The maximum resolution of the resist was defined as the minimum line width of the lines and spaces that separated at the optimum exposure.

The formulation of resist compositions and their maximum resolution are shown in Table 2.

TABLE 2

| | Polymer (pbw) | Photoacid generator (pbw) | Basic compound (pbw) | Solvent (pbw) | Sensitivity (mJ/cm$^2$) | Resolution (nm) |
|---|---|---|---|---|---|---|
| Example | Polymer 1 (100) | PAG1 (2) | tributylamine (0.1) | PGMEA (900) | 39 | 105 |
| | Polymer 2 (100) | PAG1 (2) | tributylamine (0.1) | PGMEA (900) | 39 | 105 |
| | Polymer 3 (100) | PAG1 (2) | tributylamine (0.1) | PGMEA (900) | 41 | 105 |

TABLE 2-continued

|  | Polymer (pbw) | Photoacid generator (pbw) | Basic compound (pbw) | Solvent (pbw) | Sensitivity (mJ/cm$^2$) | Resolution (nm) |
|---|---|---|---|---|---|---|
|  | Polymer 4 (100) | PAG1 (2) | tributylamine (0.1) | PGMEA (900) | 40 | 105 |
|  | Polymer 5 (100) | PAG1 (2) | tributylamine (0.1) | PGMEA (900) | 37 | 100 |
|  | Polymer 6 (100) | PAG1 (2) | tributylamine (0.1) | PGMEA (900) | 32 | 95 |
|  | Polymer 7 (100) | PAG1 (2) | tributylamine (0.1) | PGMEA (900) | 42 | 105 |
|  | Polymer 8 (100) | PAG1 (2) | tributylamine (0.1) | PGMEA (900) | 39 | 105 |
|  | Polymer 9 (100) | PAG1 (2) | tributylamine (0.1) | PGMEA (900) | 30 | 95 |
|  | Polymer 10 (100) | PAG1 (2) | tributylamine (0.1) | PGMEA (900) | 30 | 95 |
|  | Polymer 11 (100) | PAG1 (2) | tributylamine (0.1) | PGMEA (900) | 42 | 110 |
|  | Polymer 12 (100) | PAG1 (2) | tributylamine (0.1) | PGMEA (900) | 29 | 100 |
|  | Polymer 13 (100) | PAG1 (2) | tributylamine (0.1) | PGMEA (900) | 40 | 100 |
|  | Polymer 14 (100) | PAG1 (2) | tributylamine (0.1) | PGMEA (900) | 30 | 95 |
|  | Polymer 15 (100) | PAG1 (2) | tributylamine (0.1) | PGMEA (900) | 38 | 100 |
|  | Polymer 16 (100) | PAG1 (2) | tributylamine (0.1) | PGMEA (900) | 41 | 100 |
|  | Polymer 17 (100) | PAG1 (2) | tributylamine (0.1) | PGMEA (900) | 37 | 100 |
|  | Polymer 18 (100) | PAG1 (2) | tributylamine (0.1) | PGMEA (900) | 29 | 95 |
| Comparative Example | Polymer 19 (100) | PAG1 (2) | tributylamine (0.1) | PGMEA (900) | 39 | 105 |
|  | Polymer 20 (100) | PAG1 (2) | tributylamine (0.1) | PGMEA (900) | 44 | 115 |

In Table 2, a comparison of resolution is made between polymers having the identical acid labile group in order to eliminate the effect of acid labile group on resolution. The maximum resolution of a composition of Comparative Example based on a polymer having only fluorinated alcohol as a polar group (Polymer 19), possessing an anti-swelling capability and affording a high resolution can be reproduced by compositions using polymers having partially replaced therein lactone structure-containing polar groups (Polymers 1-4, 7, 8, 11, 13, 15, 16). By contrast, a composition using a polymer having some polar groups replaced by ester (Polymer 20) failed to achieve a high resolution due to pattern collapse probably by swelling.

A further comparison between a resin having a linker on the chain and a resin having a lactone ring directly bonded to an alicyclic structure demonstrates that the latter resin provides a higher resolution (as seen from a comparison of Polymers 1-4, 7 and 8 with Polymer 11, and a comparison of Polymers 6, 9 and 10 with Polymer 12).

Etching Test

A positive resist-forming coating solution was prepared by dissolving 100 parts by weight of a polymer (Polymer 1, 7, 9 or 19), 2.0 parts by weight of a photoacid generator (PAG1: triphenylsulfonium nonafluoro-n-butanesulfonate), 0.2 part by weight of triethanolamine, and 0.1 part by weight of a surfactant X-70-093 (Shin-Etsu Chemical Co., Ltd.) in 900 parts by weight of PGMEA, followed by filtration through a filter having a pore diameter of 0.2 μm. The resist solution was spin coated onto a silicon wafer and baked at 110° C. for 90 seconds to form a resist film of 200 nm thick. The wafer having the resist film formed thereon was subjected to dry etching. A difference in resist film thickness before and after the etching test was determined. Using a dry etching instrument TE-8500P by Tokyo Electron Ltd., the resist film was etched with oxygen gas under the conditions: chamber pressure 60 Pa, RF power 600 W, Ar gas flow rate 40 ml/min, O$_2$ gas flow rate 60 ml/min, gap 9 mm, and etching time 60 seconds. The results are shown in Table 3.

TABLE 3

| Polymer | O$_2$ gas etching rate (nm/min) |
|---|---|
| Polymer 1 | 11 |
| Polymer 7 | 10 |
| Polymer 9 | 12 |
| Polymer 19 (Comparison) | 240 |

It is demonstrated that the partial substitution of lactone structures for fluorinated alcohol units improves the etching resistance of resist under oxygen reactive etching conditions.

The resist composition of the invention has solved the problem of a low selective etching ratio between a resist film and an organic film during oxygen reactive etching that a prior art resist composition using a resin having fluorinated alcohol as a polar group suffers from. It prevents swelling while maintaining necessary physical properties and ensures a resolution comparable to that of the prior art resist composition. The invention thus offers a suitable material and substrate processing method for use in the bilayer resist process.

Japanese Patent Application No. 2006-035111 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising
(A) a silicone resin,
(B) an acid generator,
(C) an organic nitrogen-containing compound, and
(D) an organic solvent,
said silicone resin (A) being obtained through cohydrolytic condensation of a mixture comprising hydrolyzable silane monomers having the general formulae (1), (2) and (3):

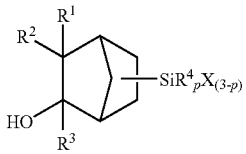
(1)

(2)

(3)

wherein

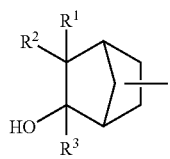

is selected from the group consisting of the following formulae:

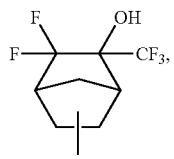 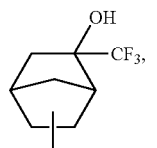 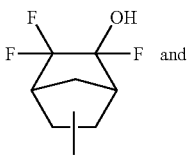 and

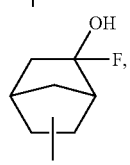

$R^4$ is a $C_1$-$C_6$ hydrocarbon group with a straight, branched or cyclic structure,
$R^5$ is an organic group selected from the group consisting of the following formulae:

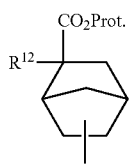 and 

wherein $R^{12}$ is hydrogen, fluorine, methyl or trifluoromethyl, $R^{13}$ is hydrogen, fluorine, methyl or trifluoromethyl, and Prot. is a protecting group selected from the group consisting of the following formulae:

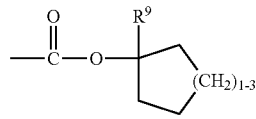

wherein $R^9$ is $C_1$-$C_6$ straight, branched or cyclic alkyl,

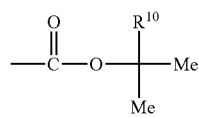

wherein $R^{10}$ is $C_2$-$C_6$ straight, branched or cyclic alkyl, norbornyl or adamantyl, and Me is methyl, and

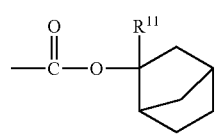

wherein $R^{11}$ is $C_1$-$C_6$ straight or branched alkyl,
$R^6$ is as defined for $R^4$,
$R^7$ is an organic group selected from the group consisting of the following formulae (5) and (6):

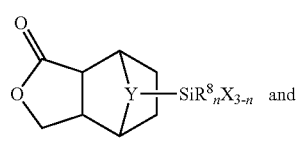
(5)

(6)

wherein Y is an oxygen atom, sulfur atom or methylene group,
$R^8$ is as defined for $R^4$,
X is hydrogen, chlorine, bromine, or a straight, branched or cyclic $C_1$-$C_6$ alkoxy group,
p is 0 or 1, q is 0 or 1, and r is 0 or 1.

2. The resist composition of claim 1, wherein the silane monomer of formula (1) is a silane monomer having the structure (4):

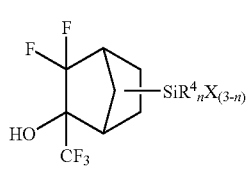
(4)

wherein $R^4$ and X are as defined above, and n is 0 or 1.

3. The resist composition of claim 1, wherein in formula (3), $R^7$ is an organic group having an alicyclic structure and a 5-membered lactone structure bonded thereto, and the silicon atom is bonded to one of carbon atoms in the alicyclic structure.

4. The resist composition of claim 1, wherein the silane monomer of formula (3) is a silane monomer having the structure (5) or (6):

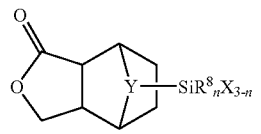

(5)

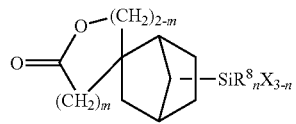

(6)

wherein Y is an oxygen atom, sulfur atom or methylene group, $R^8$ and X are as defined above, n is 0 or 1, and m is 0 or 1.

5. The resist composition of claim 1, wherein said mixture further comprises a hydrolyzable monomer having at least two hydrolyzable substituent groups other than formulae (1), (2) and (3).

6. The resist composition of claim 1, wherein said mixture further comprises a compound having the general formula (7):

$$SiX_4 \qquad (7)$$

wherein X is as defined above.

7. A pattern forming process comprising the steps of:
forming a pattern on an aromatic-containing resin film using the resist composition of claim 1, and
etching the resin film through the resulting pattern as an etching mask for thereby patterning the resin film.

8. The pattern forming process of claim 7, wherein the etching step uses a gas plasma containing oxygen.

\* \* \* \* \*